(12) United States Patent
Wang et al.

(10) Patent No.: US 11,609,247 B2
(45) Date of Patent: Mar. 21, 2023

(54) SYSTEM AND METHOD FOR ACTIVE S11 DETECTION IN PHASED ARRAY TRANSCEIVERS

(71) Applicant: QUALCOMM Incorporated, San Diego, CA (US)

(72) Inventors: Chuan Wang, San Diego, CA (US); Li Liu, San Diego, CA (US); Kevin Hsi-Huai Wang, San Diego, CA (US); Bhushan Shanti Asuri, San Diego, CA (US); Shrenik Patel, Rancho Santa Fe, CA (US); Anushruti Bhattacharya, San Diego, CA (US); Laya Mohammadi, San Diego, CA (US); Sang-June Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 337 days.

(21) Appl. No.: 17/076,581

(22) Filed: Oct. 21, 2020

(65) Prior Publication Data

US 2022/0120788 A1 Apr. 21, 2022

(51) Int. Cl.
*G01R 15/18* (2006.01)
*G01R 19/10* (2006.01)
(Continued)

(52) U.S. Cl.
CPC ............ *G01R 15/18* (2013.01); *G01R 19/10* (2013.01); *H01Q 3/30* (2013.01); *H01Q 23/00* (2013.01); *H04B 1/04* (2013.01)

(58) Field of Classification Search
CPC .... G01R 15/18; G01R 33/3852; G01R 35/00; G01R 19/25; G01R 19/10; H01Q 3/30;
(Continued)

(56) References Cited

U.S. PATENT DOCUMENTS 9,923,269 B1 * 3/2018 Hageman ............... H01Q 3/36
11,018,425 B1 * 5/2021 Hageman ............... H01Q 3/267
(Continued)

FOREIGN PATENT DOCUMENTS

CN 107733379 A 2/2018
WO 2016126368 A1 8/2016

OTHER PUBLICATIONS

International Search Report and Written Opinion—PCT/US2021/055388—ISA/EPO—dated Feb. 2, 2022.

*Primary Examiner* — Khanh C Tran
(74) *Attorney, Agent, or Firm* — Procopio, Cory, Hargreaves & Savitch LLP/Qualcomm

(57) ABSTRACT

Devices and methods for detection of active return loss for an antenna element of a plurality of antenna elements of a phased array antenna are provided. An exemplary device can convert a voltage differential at an input of a power amplifier (PA) to first current. The device can convert a coupled voltage corresponding to a signal transmitted from the PA to a respective antenna element, to a second current. The device can convert a reflected voltage corresponding to a signal reflected from the respective antenna element, to a third current. The device can convert the first current, the second current, and the third current to an output voltage at a generator output. The device can further have a controller that can adaptively generate codebooks for transmission based on the output voltage.

30 Claims, 8 Drawing Sheets

(51) Int. Cl.
*H01Q 3/30* (2006.01)
*H01Q 23/00* (2006.01)
*H04B 1/04* (2006.01)

(58) Field of Classification Search
CPC ........ H01Q 23/00; H04B 1/04; H04B 1/0458; H04B 17/103; H04B 17/102
See application file for complete search history.

(56) References Cited

U.S. PATENT DOCUMENTS

| | | | |
|---|---|---|---|
| 2005/0059362 A1* | 3/2005 | Kalajo | H03F 3/191 455/127.1 |
| 2014/0226748 A1* | 8/2014 | Dorosenco | H03F 3/68 375/295 |
| 2015/0124672 A1* | 5/2015 | Lindoff | H03F 3/19 370/311 |
| 2018/0294540 A1 | 10/2018 | Cheng et al. | |
| 2021/0067041 A1* | 3/2021 | Cho | H02M 3/156 |
| 2021/0067182 A1* | 3/2021 | Ravi | H04B 1/0475 |
| 2021/0399695 A1* | 12/2021 | Kultran | H03K 19/173 |
| 2022/0018882 A1* | 1/2022 | Bellaouar | G01R 21/10 |

* cited by examiner

SYSTEM AND METHOD FOR ACTIVE S11 DETECTION IN PHASED ARRAY TRANSCEIVERS

BACKGROUND

Technical Field

This disclosure relates to wireless communications. More specifically, this disclosure relates to phased array antenna management for millimeter wave (MMW) transmissions.

Related Art

Wireless communication systems are widely deployed to provide various telecommunication services such as telephony, video, data, messaging, and broadcasts. Wireless communication systems can employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

Such multiple access technologies have been adopted in various telecommunication standards to provide a common protocol that enables different wireless devices to communicate on a municipal, national, regional, and even global level. An example telecommunication standard is 5G New Radio (NR). 5G NR can support various wireless communication services, such as Enhanced mobile broadband (eMBB) targeting wide bandwidth (e.g. 80 MHz beyond), millimeter wave (mmW) targeting high carrier frequency (e.g. 60 GHz), massive MTC (mMTC) targeting non-backward compatible MTC techniques, and/or mission critical targeting ultra-reliable low latency communications (URLLC).

Due to the relatively high attenuation of MMW transmissions, multiple-antenna arrays may be used to increase the accuracy and gain of received transmissions. Some of the antennas arrays may be multiple-in, multiple-out (MIMO) antenna arrays or phased array systems Implementations of 5G NR systems can include phased array antennas in both mobile wireless devices, such as a user equipment (UE), and larger, stationary systems, such as customer premises equipment (CPE), enabling directional transmission of signals. Some of the phased array antennas have large numbers of elements. In large arrays, coupling between antenna elements can be problematic.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

One aspect of the disclosure provides a device for detection of active return loss for an antenna element of a plurality of antenna elements of a phased array antenna. The device can have a power amplifier (PA) having an output coupled to the antenna element of the plurality of elements via a transmission line. The device can have a first current sensor coupled to an input of the PA. The first current sensor can convert a voltage at the input to a first current. The device can have a second current sensor in communication with the transmission line. The second current sensor can convert a coupled voltage corresponding to a signal transmitted from the PA to the antenna element, to a second current. The second current sensor can convert a reflected voltage reflected from the antenna element, to a third current. The device can have a voltage generator coupled to the first current sensor and the second current sensor and configured to convert the first current, the second current, and the third current to an output voltage at a generator output.

Another aspect of the disclosure provides an apparatus for detection of active return loss for each antenna element of a plurality of antenna elements of a phased array antenna. The apparatus can have means for amplifying coupled to each antenna element of the plurality of elements via a transmission line. The apparatus can have first sensing means for sensing voltage at an input of the means for amplifying. The first sensing means can convert the voltage at the input to first current. The apparatus can have a second sensing means for sensor voltage on the transmission line. The second sensing means can have means for converting a coupled voltage corresponding to a signal transmitted from the means for amplifying to a respective antenna element, to a second current. The apparatus can have means for converting a reflected voltage reflected from the respective antenna element to a third current. The apparatus can have means for generating a voltage based on the first current, the second current, and the third current.

Another aspect of the disclosure provides a triple mode power detector for detecting active return loss for each antenna element of a plurality of antenna elements of a phased array antenna. The triple mode power detector can have a differential RMS current sensor configured to convert a first voltage differential at an input of a power amplifier (PA) to first current, the PA being coupled to a respective antenna element of the plurality of antenna elements via a transmission line. The triple mode power detector can have an RMS current sensor. The RMS current sensor can convert a coupled voltage corresponding to a signal transmitted from the PA to the respective antenna element, to a second current. The RMS current sensor can convert a reflected voltage corresponding to a signal reflected from the respective antenna element, to a third current. The triple mode power detector can have a voltage generator coupled to the DRCS and the RCS and configured to convert the first current, the second current, and the third current to an output voltage at a generator output.

Another aspect of the disclosure provides a method for detecting active return loss for each antenna element of a plurality of antenna elements of a phased array antenna. The method can include converting a voltage to a first current, the voltage sensed by a first current sensor coupled to an input of a power amplifier (PA), wherein the PA has an output coupled to the antenna element of the plurality of elements via a transmission line. The method also includes, by a second current sensor in communication with the transmission line, converting a coupled voltage corresponding to a signal transmitted from the PA to the antenna element, to a second current; and converting a reflected voltage reflected from the antenna element, to a third current. The method further includes converting, by a voltage generator coupled to the first current sensor and the second current sensor, the first current, the second current, and the third current to an output voltage at a generator output.

Other features and advantages will be apparent to one of ordinary skill with a review of the following description.

BRIEF DESCRIPTION OF THE DRAWINGS

The details of embodiments of the present disclosure, both as to their structure and operation, can be gleaned in part by study of the accompanying drawings, in which like reference numerals refer to like parts, and in which.

DETAILED DESCRIPTION

Figure 1:
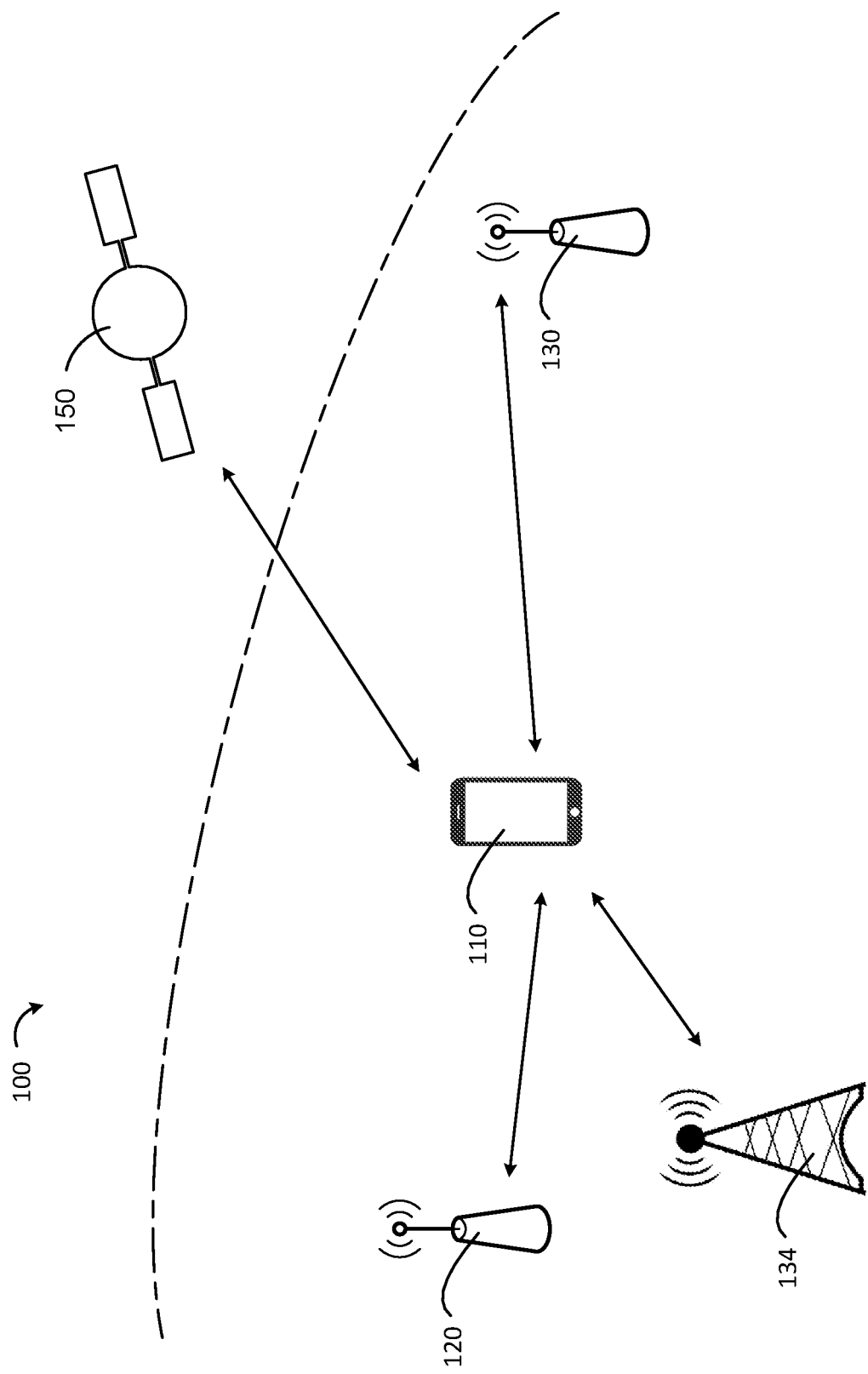
FIG. 1 is a graphical representation of a wireless communication system.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Various next generation wireless technologies (e.g., 5G, certain WLAN standards) in millimeter wave (mmW) bands implement phased-array transceivers. As used herein, a phased array usually means an electronically scanned array, for example a computer-controlled array of antennas that form one or more beams of radio waves that can be electronically steered to point in different directions, without moving the antennas. In an array antenna (e.g., a phased array), the radio frequency signal from the transmitter is fed to the individual antennas with the correct phase relationship so the radio waves from the separate antennas, via constructive and destructive interference, add together to increase the radiation in a desired direction in the far field, while cancelling to suppress radiation in undesired directions in the far field. Because the array includes multiple antennas to achieve high antenna array gain, phased arrays become more practical as the frequency increases and the individual antenna element size becomes smaller.

In phased array transmitters, particularly large phased array transmitters, multiple antenna elements may couple, resulting in large amounts of reflected power to a power amplifier (PA) powering a given antenna element. The reflected power can be described in terms of a reflection coefficient, also known as s11. The reflection coefficient also forms the basis of the voltage standing wave ratio (VSWR). Large s11 variations can impact PA reliability over time, ultimately resulting in PA failure and decrease in antenna array performance. For example, active s11 can cause large output voltage swings in one or more elements of the phased array or cause redundant power consumption, cancelling signals at coupled elements. This is further detrimental to overall effectively isotropically radiated power (EIRP).

Certain aspects of the present disclosure are directed to detecting antenna elements that experience high s11 and shutting them off, to increase long term reliability, as well as improve power consumption. Certain disclosed systems and methods provide active VSWR detection and corresponding system control for a large phased array. Certain disclosed systems can provide improved accuracy in VSWR measurement without a high-directivity coupler. Some such systems can be implemented in a relatively small area, which may reduce impacts on already minimal space in a 5G mmW phased array.

FIG. 1 is a graphical representation of a wireless communication system. A wireless communications system (system) 100 can include a wireless device 110. The wireless device 110 can have a (multi-band) millimeter wave (mmW) transceiver. The system 100 can be a 5G system, a long term evolution (LTE) system, a code division multiple access (CDMA) system, a global system for mobile communications (GSM) system, one of the various members of the IEEE 802.XX (e.g., Wi-Fi or mmW Wi-Fi) families of wireless protocols, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). The system 100 can also include a first base station (BS) 120 and a second BS 130 in communication with the wireless device 110. In general, the system 100 can include any number of base stations and any number of network entities. Any or all of the devices described in connection with FIG. 1 can implement a multi-element antenna array, or phased array antenna.

The wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, an internet of things (IoT) device, an apparatus in an automobile, a medical device, a Bluetooth device, etc. The wireless device 110 may be capable of communicating with the first BS 120 and the second BS 130. The wireless device 110 may also be capable of receiving signals from broadcast stations (e.g., a broadcast station 134), signals from one or more satellites 150 in one or more global navigation satellite systems (GNSS), etc. Further, the wireless device 110 may be capable of communicating directly with another wireless device (not illustrated) in addition to or instead of communicating through one of the illustrated networks. The wireless device 110 may support one or more radio technologies for wireless communications such as 5G, LTE, CDMA2000, WCDMA, TD-SCDMA, GSM, 802.11, etc.

Figure 2:
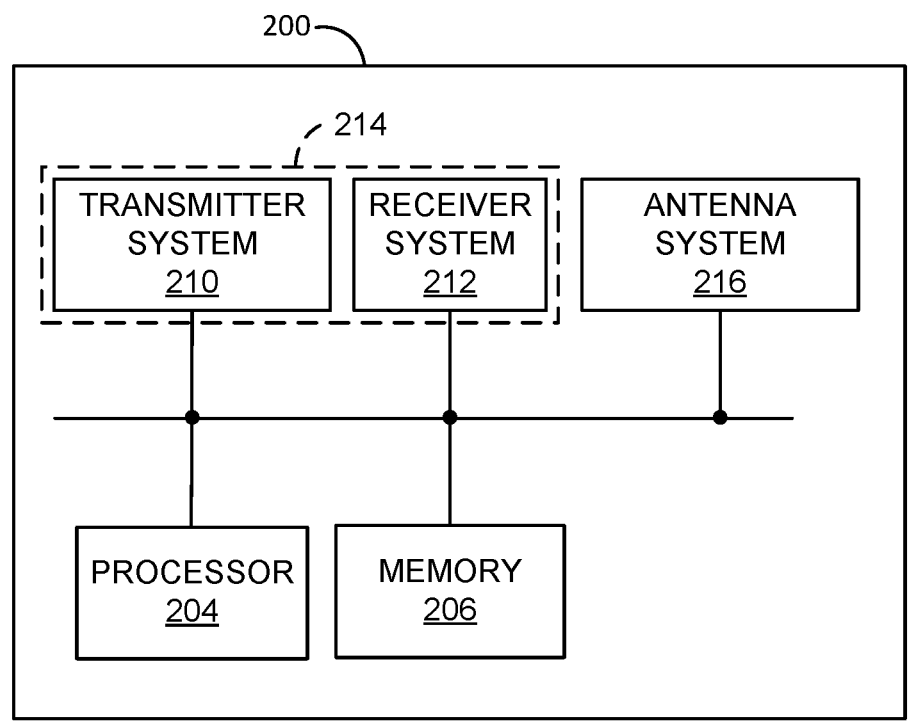
FIG. 2 is a functional block diagram of a communication device for use with the system of FIG. 1.

FIG. 2 is a functional block diagram of a communication device for use with the system of FIG. 1. A communication device 200 can be implemented as one or more of the wireless device 110, the first BS 120, the second BS 130, the broadcast station 134, and the satellite 150.

The device 200 can include one or more processors or processor units (processor) 204. The processor 204 can control operation of the device 200. The processor 204 can also be referred to herein as a central processing unit (CPU). The processor 204 can include or be a component of a processing system or controller implemented with one or more processors 204. The one or more processors can be implemented with any combination of general-purpose microprocessors, microcontrollers, neural processing units (NPUs), on one or more application specific integrated circuits (ASICs), digital signal processors (DSPs), field programmable gate arrays (FPGAs), programmable logic devices (PLDs), controllers, state machines, gated logic, discrete hardware components, dedicated hardware finite state machines, or any other suitable entities that can perform calculations or other manipulations of information. In some embodiments, the processors 204 can also perform quantum computing functions. In some embodiments, the processor 204 comprises a modem and/or an applications processor.

The device 200 can also have a memory 206 coupled to the processor 204. The memory 206 can include both read-only memory (ROM) and random access memory (RAM). The memory 206 can provide instructions and data to the processor 204. The memory 206 may store program codes, instructions, and data for the processor 204. The memory 206 can further store a codebook (e.g., an adaptive codebook) for storing beamforming codes for a phased array antenna. Each codebook may contain (beamforming) codes that represent weighting or phase shifts that can be applied to different versions of the signal(s) transmitted from the phased array to properly form beams. This is described in more detail in connection with FIG. 3.

At least a portion of the memory 206 can also include non-volatile random access memory (NVRAM). The processor 204 can perform logical and arithmetic operations based on program instructions stored within the memory 206. The instructions in the memory 206 can be executable to implement the methods described herein. The processor 204 and the memory 206 can also include machine-readable media for storing software. Software shall be construed broadly to mean any type of instructions, whether referred to as software, firmware, middleware, microcode, hardware description language, machine learning, artificial intelligence (AI), or otherwise. Instructions can include code (e.g., in source code format, binary code format, executable code format, or any other suitable format of code). The instructions, when executed by the one or more processors, cause the processing system to perform the various functions described herein.

The device 200 can also include a transmitter system 210 and/or a receiver system 212 to allow transmission and reception of data between the device 200 and a remote location. The transmitter system 210 and the receiver system 212 can be combined into a transceiver system 214. Reference to the transceiver system 214 herein can be considered to impute the necessary or compatible characteristics and functions to the transmitter system 210 and the receiver system 212 as appropriate. The device 200 can also have an antenna system 216 communicatively coupled to the transceiver system 214. The antenna system 216 can have a plurality of individual antenna elements (FIG. 4) arranged, for example, in a multi-element patch antenna or other kind of phased array to enable beamforming.

The transceiver system 214 can include multiple transmitters (e.g., in the transmitter system 210), multiple receivers (e.g., in the receiver system 212), multiple transceivers, and/or multiple antennas as needed for various communication standards.

The transmitter system 210 (e.g., or the transceiver system 214) can be configured to wirelessly transmit packets having different packet types or functions. For example, the transmitter system 210 can be configured to transmit packets of different types generated by the processor 204. For example, the processor 204 can be configured to determine the type of packet and to process the packet and/or fields of the packet accordingly.

The receiver system 212 (e.g., or the transceiver system 214) can be configured to wirelessly receive packets or other information having different packet types. In some examples, the processor 204 and/or the receiver system 212 can be configured to detect a type of a packet used and to process the packet accordingly.

Figure 3:
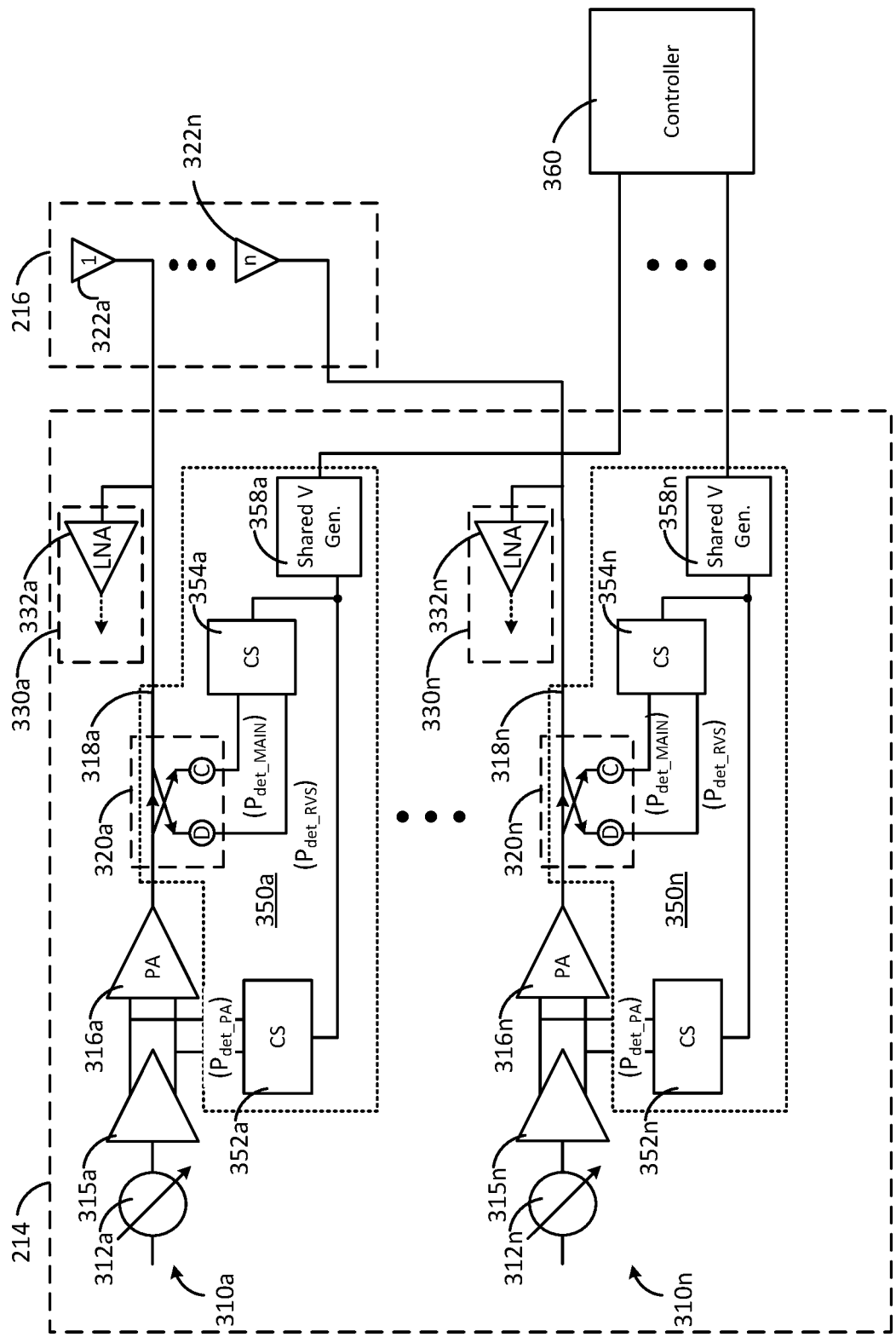
FIG. 3 is a schematic diagram of portions of the communication device of FIG. 2.

FIG. 3 is a functional block diagram of portions of the communication device of FIG. 2. The transceiver system 214 can have multiple transmit chains generally referenced as 310, and individually shown as transmit chain 310a through transmit chain 310n, indicated by an ellipsis. Each transmit chain 310 can be communicatively coupled with the processor 204 to receive packets or other data for transmission.

The transceiver system 214 can have multiple receivers and multiple transmitters coupled to the antenna system 216 to support multiple frequency bands, multiple radio technologies, carrier aggregation, transmit/receive diversity, multiple-input multiple-output (MIMO) transmission from multiple transmit antennas to multiple receive antennas, etc.

The transceiver system 214 can further have multiple receive chains 330. Only a low noise amplifier 332 is shown in the receive chains 330 for simplicity. The receive chains 330 can receive signals/transmissions from the antenna system 216 for processing.

The processor 204 can further perform processing for data being received via the receivers of the receiver system 212 and data being transmitted via the transmitters of the transmit system 210. The processor 204 may control the operation of the various circuits within the transceiver system 214.

The transmit chain 310a can have a phase shifter 312a. The phase shifter 312a can, in coordination with other phase shifters 312 (e.g., 312a-312n), adjust the phase of a transmitted signal to achieve proper beamforming at different antenna elements of the antenna array.

The transmit chain 310a can have a power amplifier 316a coupled to the phase shifter 312a via a driving amplifier (DA) 315a. The transmit chain 310n can have a power amplifier 316n coupled to the phase shifter 312n via a DA 315n. In the illustrated embodiment, the DAs 315a-315n can be used to amplify the small signals from phase shifters (312a-n) and provide appropriate voltage swing at the input of power amplifiers (316a-n). The DAs 315a-315n are also configured to output a differential signal in the illustrated embodiment (and can be configured to convert a single-ended signal to a differential signal). In other embodiments, the DAs 315a-n are configured to output a single-ended signal or are omitted. The power amplifier 316a can impose a gain on the transmitted signal provided by, for example, the processor 204. An output of the power amplifier 316 can be coupled to one or more antenna elements 322 (labeled 322a-322n) of the antenna system 216. In some implementations, the antenna system 216 can include a phased array antenna or an array of patch antennas having antenna elements 1-n. The antenna system 216 can have a plurality of antenna elements 322 arranged to produce desired beamforming patterns. In some examples, the antenna elements 322 can be arranged in a square (e.g., 5 by 5), a rectangle (e.g., 2 by 6), a line or linear pattern, or other arrangement as needed. For example, a mobile phone may have a smaller, 1 by 4 or 2 by 2 or 3 by 4 patch antenna, whereas a larger CPE antenna can have five by five antennas, eight by eight antennas, or many more antennas. The antenna elements 322 are described primarily in connection with the transmit chains 310, however the antenna system 216 and the antenna elements 322 are also coupled to the receive chains 330 (e.g., receive chains 330a-330n) for receive operations at the antenna system 216.

For data transmission, the processor 204 processes (e.g., encodes and modulates) data to be transmitted and provides an analog output signal to a selected transmitter (e.g., of the transmit chain 310a). Within the transmit chain 310a, various transmit circuits can amplify, filter, and upconvert an analog output signal from baseband to RF and provide a modulated RF signal. The transmit chain 310a may include amplifiers, filters, mixers, matching circuits, an oscillator, a local oscillator (LO) generator, a PLL, etc. The power amplifier 316a can receive and amplify the modulated RF signal and provide a transmit RF signal having the proper output power level. The transmit RF signal is routed through the antenna system 216 via the antennas 322. Each of the other transmit chains 310 (e.g., through transmit chain 310n) may operate in a similar manner as the transmit chain 310a.

The codebook, or adaptive codebook as used herein, can store beamforming weights (e.g., power and/or phase) for each antenna element 322 of the phased array antenna system 216. The beamforming codes can cause various beamforming patterns that direct the energy of the entire antenna system 216 based on phase shifts of the individual antenna elements 322. Where the codebooks provide a zeroed power for an antenna element 322 the antenna element may be considered turned off (e.g., deactivated or otherwise not operating or adding to forming a beam). A beamforming lookup table can be provided for each beamforming angle based on the codebook. The beam forming lookup table can provide the beamforming codes for the antenna elements 322 to properly form a beam at a given beamforming angle. For example, a lookup table for a given beamforming angle provides beamforming weights (e.g., power and/or phase) for each antenna element 322 for forming the beam at the given angle. That is, the codebook may provide beamforming codes on an antenna element basis, while the beamforming lookup table provides the beamforming codes on a beam forming angle basis.

In the exemplary embodiment of FIG. 3, the transceiver system 214 may also include other circuits not shown in FIG. 3, such as filters, matching circuits, etc. All or a portion of transceiver system 214 may be implemented on one or more analog integrated circuits (ICs), RF ICs (RFICs), mixed-signal ICs, etc. In some embodiments, all of the elements of the transceiver system 214 illustrated in FIG. 3 and all of the antennas 322 (e.g., for a single phased array) are included in a module together. In other embodiments, one or more elements of the transceiver system 214 (e.g., the phase shifters 312) are implemented on a different IC or in a different module/package from the rest of the elements of the transceiver 214 illustrated in FIG. 3.

In some implementations, LNAs 332 and PAs 316 are example implementations of LNAs and PAs of the exemplary transceiver system 214 of FIG. 2, for example when the transceiver system 214 is configured to implement a phased-array antenna system Such phased-array systems (e.g., the antenna system 216) can be used for higher frequency communication such as 30 GHz and 60 GHz to achieve the benefits of beam forming.

The transmit chain 310a can further include a power and impedance detector (detector) 350 (labeled 350a-350n and shown in dotted lines). The detector 350 may also be referred to herein as a triple mode power detector. For example, the detector 350 can measure voltage at an input, or input power (Pdet_PA), at the PA 316, output transmitter power (Pdet_MAIN), and reflected power (Pdet_RVS) from antenna load. These three measurements can be used to adapt the codebook for a given set of beamforming codes. For example, if reflected power or s11 is very high for a given set of beamforming codes, the disclosed methods can determine when to disable certain antenna elements 322 based on s11.

The detector 350a can be inductively coupled to a transmission line 318a between the PA 316a and the antenna system 216, for example. The detector 350 can be coupled to the transmission line 318a by a coupler 320a. In some implementations, the coupler 320a can be a compact or low directivity coupler. A compact coupler can be advantageous because the relative size requirements are small. The coupler 320a can be a single coupled transformer, for example. Each transmit chain 310 implements such a coupler 320 (e.g., couplers 320a-320n) and implementing such couplers 320 to have a smaller size can be particularly advantageous with larger phased arrays. In some implementations, the coupler 320 can be implemented as a coupled line coupler, a transformer-based coupler, a Bethe-hole coupler, a multi-hole coupler, a bi-directional coupler, or other applicable coupler. The transformer-based coupler can generally be compact, and may be used for all of the couplers 320 in some embodiments. Not all of the couplers 320, however, need be the same type of coupler. In some embodiments, one or more of the couplers 320 (e.g., the coupler 320a) are configured as a first type (e.g., a transformer-based coupler) and one or more other couplers (e.g., the coupler 320n) are configured as a second type (e.g., a Bethe-hole coupler).

The detector 350 can include a current sensor (CS) 352 (labeled CS 352a-352n). The CS 352 can sense a voltage at an input of the PA 316 (which is directly proportional to input power for a given constant impedance) and convert the voltage to a current. In this example, the PA 316 is a differential PA, and thus the CS 352 may be a differential current sensor configured to sense a voltage across the differential inputs of the PA 316 and output a current. In other examples, however, the input to the PA 316 and the CS 352 may be single-ended. Thus, the CS 352a can provide a current corresponding to the input voltage (Pdet_PA) of the PA 316a.

The coupler 320a, disposed between the PA 316a and the antenna system 216, can allow measurements of both transmitted power (at port C) and reflected power (at port D) from the antenna system 216. The coupler 320a can provide an inductive connection to the various circuitries for measuring transmitted and reflected power (FIG. 5) on the transmission line 318a.

The detector 350a can also have a current sensor (CS) 354a (labeled CS 354n in the detector 350n). The CS 354a can sense the signal or voltage for both a transmitted voltage (e.g., on the transmission line 318a) at port C (Pdet_MAIN) and a reflected voltage at port D (Pdet_RVS) and convert them to a current. The voltages at port C and port D can represent the transmitted signal and portions of the transmitted signal reflected from the antenna system 216, respectively. For example, the ratio of the voltages at port C to that at port D can also be referred to as the voltage standing wave ratio (VSWR).

The standing wave ratio (SWR), on the other hand, is a measure of impedance matching of loads to the characteristic impedance of the transmission line 318a. Impedance mismatches result in these standing waves along the transmission line 318a, and SWR is defined as the ratio of the partial standing wave's amplitude at an antinode (maximum) to the amplitude at a node (minimum) along the line. These impedances are characterized in FIG. 5, described below. As VSWR fluctuates based on the transmission, certain transmit chains 310 can have very high levels of power reflected from respective antenna elements 322. High levels of reflected power can damage the PAs 316 over time. Therefore, it may be advantageous to disable or otherwise shut down a specific transmit chain 310 or an antenna element 322 when the associated reflected power or VSWR reaches or crosses a threshold. These details can be stored in the adaptive codebook, so certain antenna elements 322 can be disabled for beamforming patterns having known high s11.

The CS 354a can produce a current corresponding to the voltage sensed or otherwise received at each of port C and port D. The reflected power/voltage sensed at port D and thus the current produced at the CS 354a can vary with the coupling between the antenna elements 322 of the antenna system 216.

The detector 350 can have a shared voltage generator 358a coupled to the CS 352a and the CS 354a (labeled shared v gen. 358n in the detector 350n). In the embodiment illustrated in FIG. 3, the voltage generator 358a can generate a voltage based on currents received from the CS 352a and the CS 354a. Fluctuations in the generated voltage may represent the change in the ratio between input power sensed at the CS 352a and the change in VSWR at the CS 354a. The change in the ratio between input power sensed at the CS 352a and the change in VSWR at the CS 354a may be determined by a controller 360 based on the generated voltage (described below). In some embodiments, a respective voltage to current converter is coupled to each CS 352, 354 (for example, in contrast to a shared voltage generator being implemented) and the outputs of the respective voltage to currently converters are separately provided to the controller 360 or the outputs are coupled to a common path that is coupled to the controller 360. In other embodiments, a comparator or other circuitry configured to sense changes between the input power of the PA 316 and VSWR on the transmission line 318 is implemented instead of the shared voltage generator 358 (and/or portions of the controller 360).

The transceiver system 214 can be coupled to a controller 360. The controller 360 can be implemented with one or more processors or microprocessors. In some implementations, the controller 360 can be implemented by the processor 204 (FIG. 2).

The controller 360 can be coupled to outputs of the voltage generators 358 from all of the transmit chains 310. While the voltage generators 358 are illustrated in FIG. 3 as having outputs which are separately coupled to the control 360, in some embodiments one or more of the outputs (e.g., all of them in some embodiments) are coupled together and provided over a single cable or interface to the controller 360. Prior to transmission from a phased array antenna, the processor 204 can implement beamforming codes for each of the transmit chains 310 that shift the phase of the transmitted signal to form the desired beams at the antenna system 216. For example, the phase shifters 312 can shift the phase of a respective version of the transmitted signal to constructively or destructively interfere at the phased array during transmission. These beamforming codes can be stored in the codebook, for example, in the memory 206 by the processor 204.

The controller 360 can poll, cycle through, or interleave input/measurements from all of the voltage generators (e.g., the s11 detectors 350) to determine optimum codes for beamforming at the antenna system 216.

Figure 4:
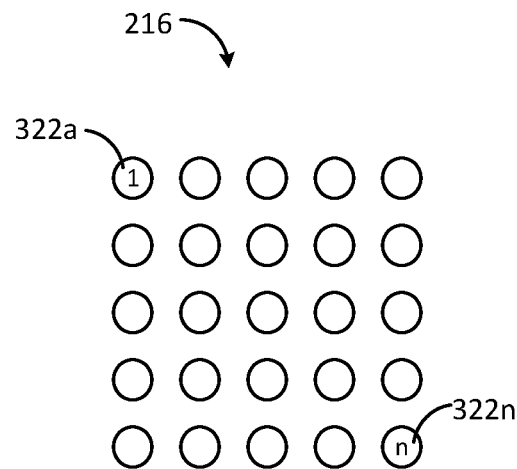
FIG. 4 is a graphical representation of an embodiment of the antenna system of FIG. 2 and FIG. 3.

FIG. 4 is a graphical representation of an embodiment of the antenna system of FIG. 2 and FIG. 3. In some implementations, the antenna system 216 can include a phased array of the antenna elements 322. Based on the variations or increases in reflected power or s11 as determined by the detectors 350, the controller 360 can disable one or more of the antenna elements 322 or disable a respective transmit chain 310 associated with s11 that rises above a predetermined threshold. This can prevent damage to PAs 316 associated with elements 322 having high active s11. This can also reduce power consumption and improve overall efficiency of the antenna system 216. Twenty-five antenna elements 322 are shown and labeled 1 through n. This number and arrangement of the antenna elements 322 is not limiting on the disclosure, as other arrangements (e.g., linear, square, rectangular, circular, etc.), and numbers of antenna elements 322 (e.g., 1-n) are possible (n is an integer greater than 1).

Figure 5:
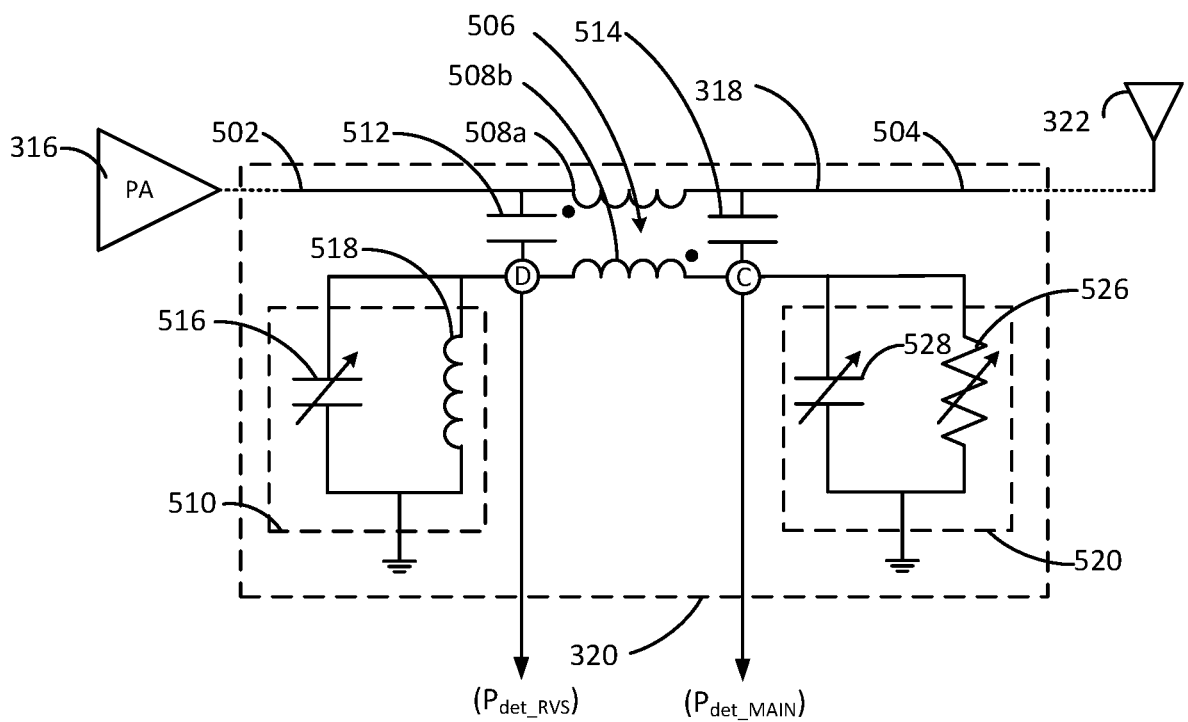
FIG. 5 is a schematic representation of an embodiment of the coupler of FIG. 3.

FIG. 5 is a graphical representation of an embodiment of the coupler of FIG. 3. The low directivity coupler 320 illustrated in FIG. 5 can be communicatively (e.g., inductively) coupled to the transmission line 318 (FIG. 3). In some implementations, a coupler input 502 is configured to receive signals for transmission, which can be provided to the coupler 320 via the PA 316. The antenna elements 322 can be coupled to a coupler output 504. The coupler 320 can be coupled to the transmission line 318 by an inductive coupling 506. The inductive coupling 506 can have a pair of elements 508a, 508b (collectively elements 508). The elements 508 can include parallel wires or windings, as needed. The coupler 320 has various benefits, including small size which can improve implementation in smaller devices, such as those required for larger phased arrays.

The coupler 320 can have a first capacitance 512 coupled to the coupler input 502 (and a first port of the winding 508a). The coupler 320 can have a second capacitance 514 coupled to the coupler output 504 (and a second port of the winding 508a). The first capacitance 512 and the second capacitance 514 can be capacitances based on the electrical characteristics and electronic components of the coupler 320 to function as set forth herein. For example, in some implementations the first capacitance 512 and the second capacitance 514 can be individual explicit capacitors with values selected for specific impedance characteristics and tuning. In other embodiments, the capacitors 512, 514 illustrated in FIG. 5 are representative of the capacitance that exists between components of the coupler 320, for example between the windings 508.

The coupler 320 can have a first capacitance 516 and an inductor 518 coupled to the first capacitance 512. The first capacitance 516 and the inductor 518 (and the first capacitance 512) can be further coupled to a first port of the winding 508b. The first capacitance 516 and the inductor 518 can be coupled in parallel to ground. The first capacitance 516 and the inductor 518 can be referred to as a reflection impedance 510 ($Z_{refl\_tune}$). The impedance can be tuned based on the operating frequency and process. In an example, the first capacitance 516 may be a first variable capacitance. In another example, the first capacitance 516 may be fixed.

The coupler 320 can have a second capacitance 526 and a resistance 528 coupled to the second capacitance 514. The second capacitance 526 and the resistance 528 (and the second capacitance 514) can be further coupled to a second port of the winding 508b. The second capacitance 526 and the resistance 528 can be coupled in parallel to ground. The second capacitance 526 and the resistance 528 can be referred to as a coupling impedance 520 ($Z_{couple\_tune}$). In an example, the second capacitance 526 may be a variable capacitance and/or the resistance 528 may be a variable resistance. In another example, the second capacitance 526 and/or resistance 528 may be fixed. When one or more of the elements 516, 526, and 528 are tunable, they may in some embodiments be adjusted by the controller 360 and/or the processor 204, for example based on the frequency of signals through the coupler 320, desired impedance, and/or to achieve balancing, etc.

Figure 6:
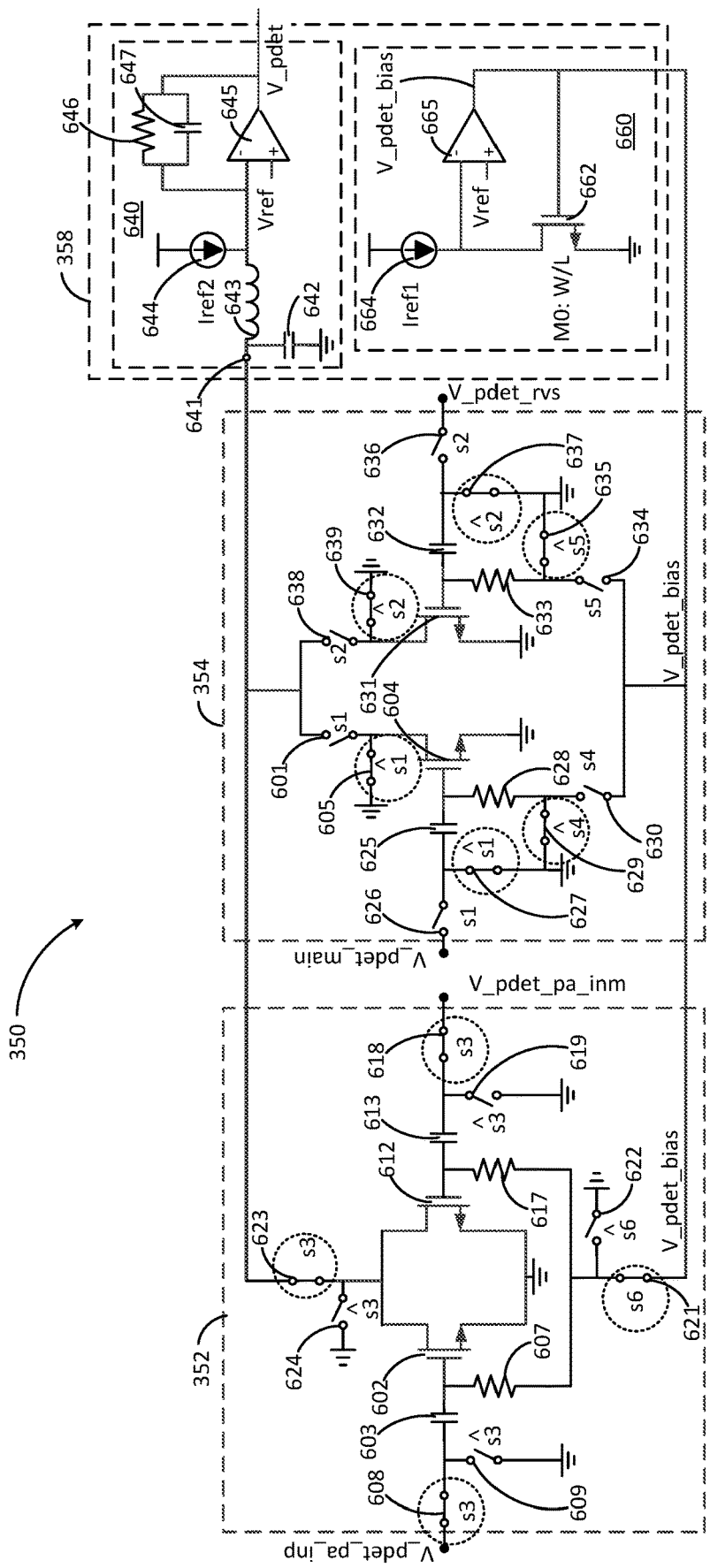
FIG. 6 is a schematic representation of an embodiment of the detector of FIG. 3 in a first state.

FIG. 6 is a graphical representation of an embodiment of the detector 350 of FIG. 3 in a first state. In the embodiments illustrated in FIGS. 6-8, the CS 352 is configured as a root mean square (RMS) current sensor (with differential inputs, as described above), and thus may be referred to as a differential RMS current sensor (DRCS).

The DRCS 352 can have a pair of transistors 602, 612 coupled together at the drains. The sources of the transistors 602, 612 can be coupled to ground. The gate of the first transistor 602 can be coupled to a first input of the PA 316 to receive a first voltage (V_pdet_pa_inp) via a series capacitor 603. Switches 608 and 609 (s3 and S3ˆ) can be disposed between the capacitor 603 and the first input of the PA 316, V_pdet_pa_inp. The switch 608 (s3) can alternately couple the capacitor 603 to the first input of the PA 316. The switch 609 (s3ˆ) can alternately couple the capacitor 603 to ground.

A resistor 607 can be coupled to the capacitor 603 and the gate of the transistor 602. A resistor 617 can be coupled to the capacitor 613 and the gate of the second transistor 612. The resistor 607 and the resistor 617 can be coupled to a pair of switches 621 (s6) and 622 (S6ˆ). The switch 621 can alternately couple the resistors 607, 617 to a bias voltage, V_p_det_bias. The switch 622 can alternately couple the resistors 607, 617 to ground.

The second transistor 612 can be coupled in a reverse configuration of the first transistor 602. The gate of the second transistor 612 can be coupled to the resistor 617 and to the second input of the PA 316 (V_pdet_pa_inm) via a capacitor 613 and a pair of switches 618, 619. The switch 618 (s3) can alternately couple the capacitor 613 to the second input of the PA 316. The switch 618 (s3ˆ) can alternately couple the capacitor 613 and the second input to the PA 316 to ground.

The drains of the first transistor 602 and the second transistor 612 can be coupled to a pair of switches 623 (s3), 624 (s3ˆ). The switch 623 can alternately couple the drains of the first transistor 602 and the second transistor 612 to the voltage generator 358. The switch 624 can alternately couple the drains of the first transistor 602 and the second transistor 612 to ground.

Figure 7:
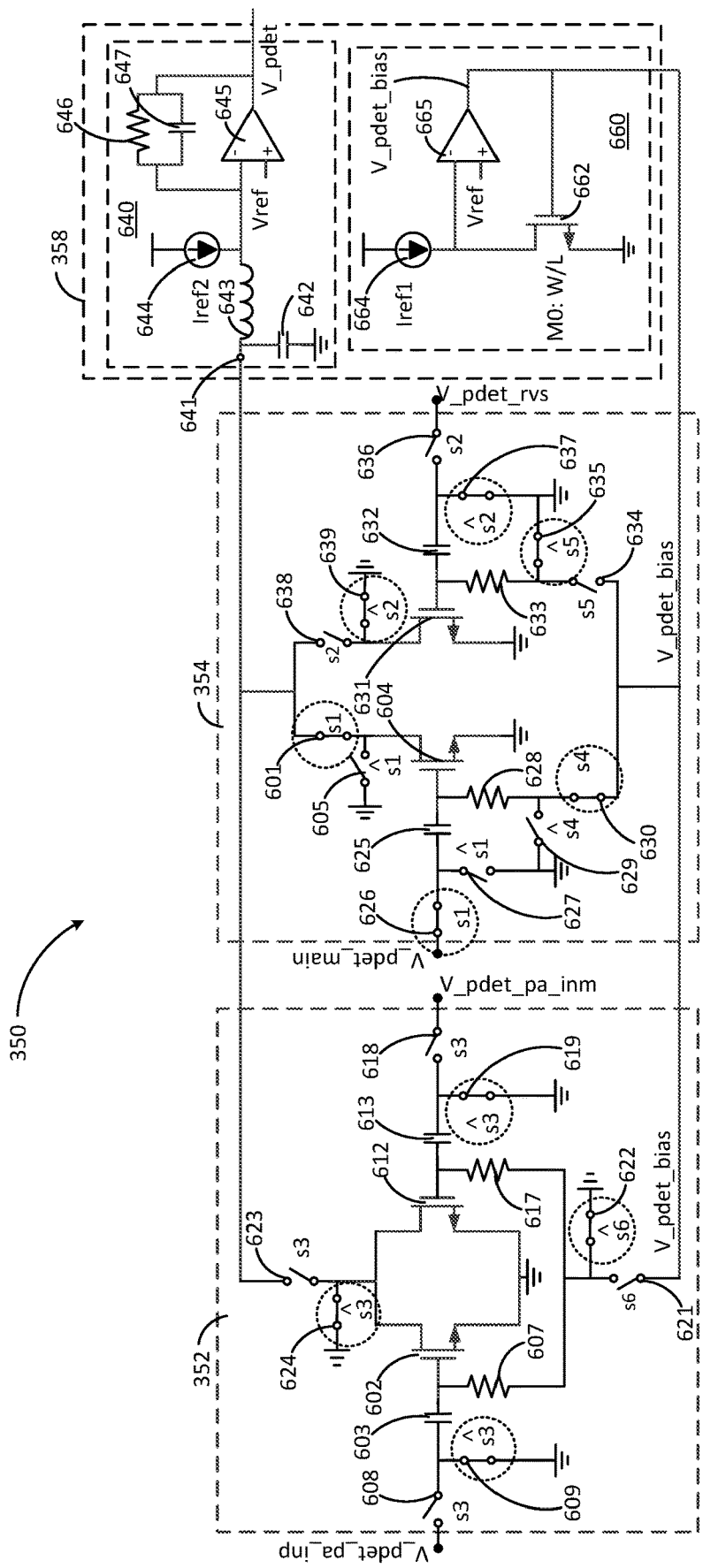
FIG. 7 is a schematic representation of a second state of the detector of FIG. 6.
Figure 8:
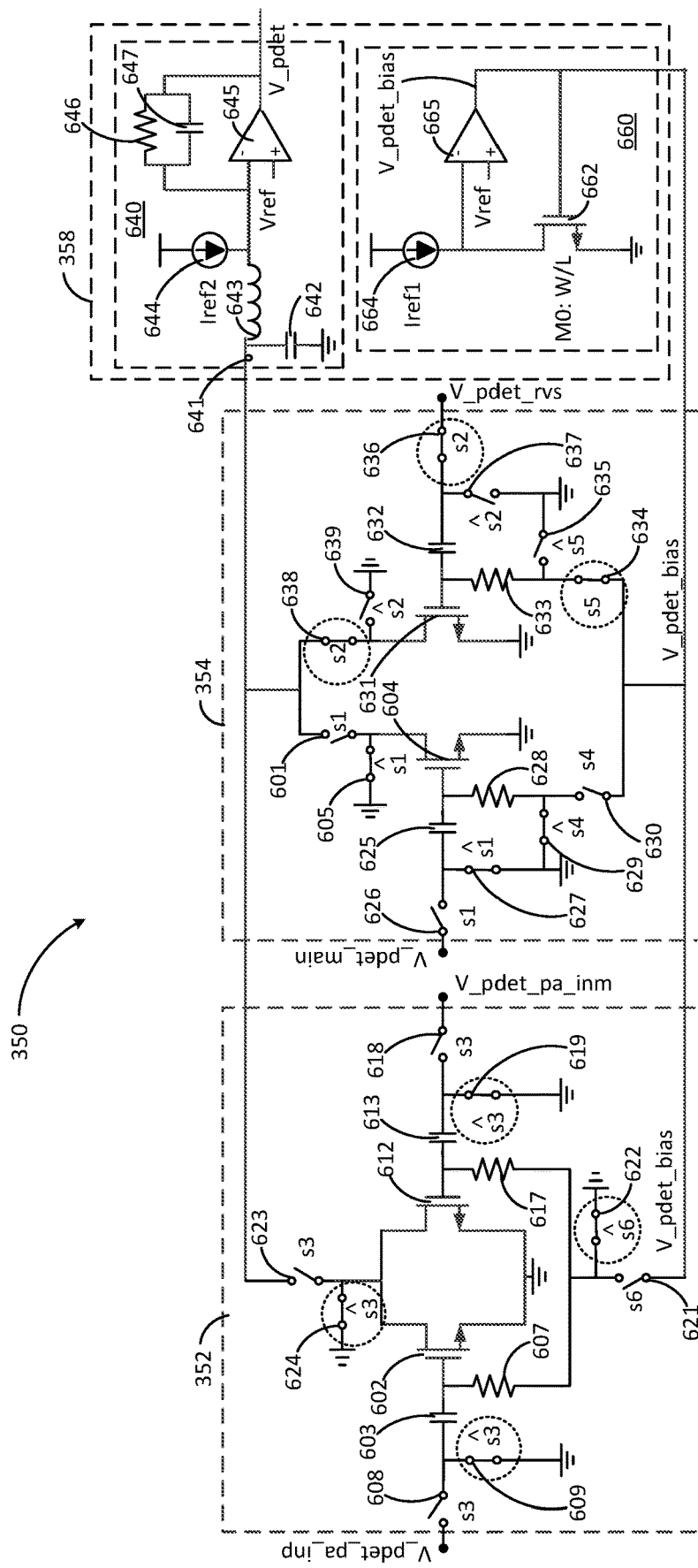
FIG. 8 is a schematic representation of a third state of the detector of FIG. 6.

In the embodiments illustrated in FIGS. 6-8, the CS 354 is configured as a root mean square (RMS) current sensor, and thus may be referred to as an RCS. The RCS 354 can have a pair of transistors 604, 631. The sources of the transistors 604, 631 can be coupled to ground. The gate of the transistor 604 can be coupled to a capacitor 625. The (opposite side of the) capacitor 625 can be coupled to a pair of switches 626 (s1), 627 (s1ˆ). The capacitor 625 can be alternately coupled to port C (or V_pdet_main) via the switch 626 (s1). The switch 627 (s1ˆ) can alternately couple the capacitor 625 to ground.

The gate of the transistor 604 can also be coupled to a resistor 628 (in addition to the capacitor 625). The opposite side of the resistor 628 can be coupled to a pair of switches 629 (s4ˆ), 630 (s4). The switch 629 can alternately couple the resistor 628 to ground. The switch 630 selectively couples transistor 604 to bias voltage (V_p_det_bias).

The gate of the transistor 631 can be coupled to a capacitor 632. The (opposite side of the) capacitor 632 can be coupled to a pair of switches 636 (s2), 637 (s2ˆ). The capacitor 632 be alternately coupled to port D (or V_pdet_rvs) via the switch 636 (s2). The switch 637 (s2ˆ) can alternately couple the capacitor 632 to ground.

The gate of the transistor 631 can also be coupled to a resistor 633. The opposite side of the resistor 633 can be coupled to a pair of switches 634 (s4), 635 (s4ˆ). The switch 635 can alternately couple the resistor 633 to ground. The switch 634 selectively couples transistor 631 to bias voltage (V_p_det_bias).

The drain of the transistor 604 can be coupled to a pair of switches 601 (s1), 605 (s1ˆ). The switch 605 can alternately couple the drain of the transistor 604 to ground. The switch 601 can alternately couple the drain of the transistor 604 to the voltage generator 358.

The drain of the transistor 631 can be coupled to a pair of switches 638 (s2), 639 (s2ˆ). The switch 639 can alternately couple the drain of the transistor 631 to ground. The switch 638 can alternately couple the drain of the transistor 631 to the voltage generator 358.

The voltage generator 358 can include an output circuit 640 and a bias circuit 660, as illustrated in FIGS. 6-8. The output circuit 640 has an input 641 coupled to the switch 623 of the DRCS 352 and the switches 601, 638 of the RCS 354. The input 641 can be coupled to ground via a capacitor 642. The input 641 can be coupled to a reference current generator 644 (labeled Iref2) via an inductor 643. The reference current generator 644 and the inductor 643 can be coupled to a first input of an amplifier 645.

The output of the amplifier 645 can have a feedback loop having a parallel resistor 646 and capacitor 647 back to the first input. The amplifier 645 can further receive a reference voltage (Vref) at a second input. An output of the amplifier (V_pdet) can be coupled to the controller 360. The output of the amplifier V_pdet can indicate variations in reflected power experienced within the system. In some embodiments, the output circuit 640 is configured as an RMS voltage generator.

The bias circuit 660 can have an amplifier 665. The amplifier 665 can receive, at a first input, a reference current from a reference current generator 664 (labeled Iref1). The amplifier 665 can receive, as a second input, the reference voltage, Vref. This reference voltage can be the same reference voltage as received at the second input of the amplifier 645, or may be different. The output (V_pdet_bias) of the amplifier 665 can be coupled to the gate of a transistor 662. The source of the transistor 662 can be coupled to ground. The source of the transistor 662 can be coupled, in feedback, to the first input to the amplifier 665. The output (V_pdet_bias) of the amplifier 665, and thus the output of the bias circuit 660 can be supplied to the DRCS 352 (at the switch 621). As conductive properties of the electronic components can vary with environmental conditions, the bias voltage provided by the bias circuit 660 can provide a baseline to normalize variations caused by varying environmental conditions. Therefore, the bias circuit 660 can reduce the influence of voltage and power level fluctuations within V_pdet based on environmental factors.

While the bias circuit 660 is illustrated as being within the voltage generator 358 in FIGS. 6-8, the bias circuit 660 may instead be implemented separate from the voltage generator 358. In some embodiments where the bias circuit 660 is separate from the voltage generator 358, the bias circuit 660 is still implemented in the detector 350, but in a block separate from the voltage generator 358. In other embodiments, the bias circuit 660 is implemented separate from the detector 350 and configured to provide a reference voltage to the detector 350.

In operation of the detector(s) 350, the controller 360 can sequentially enable the antenna elements 322 of the antenna system 216 and sense or measure the differential input voltage, or Pdet_PA (e.g., voltage across the inputs of the PA 316), for each PA 316 of each transmit chain 310. In the beam characterization (beam char) mode, this can allow the system (e.g., the controller 360) to characterize the antenna system 216 and form a dynamic codebook that the controller 360 can reference during transmissions. This can be accomplished in each transmit chain 310 as shown in the first configuration shown in FIG. 6. For example, the switches 608, 621, 623, and 618 of the DRCS 352a and switches 605, 639, 629, 635, 627, and 637 of the RCS 354a are switched on (e.g., closed). The switches that are closed are annotated with a dashed circle.

FIG. 7 is a graphical representation of a second state of the detector of FIG. 6. In a second step of the beam char mode, the controller 360 can sweep all values for Pdet_MAIN for each beam angle for each transmit chain 310 and each antenna element 322 for some specified output power range. In this configuration, the switches 609, 624, 619, 622 of the DRCS 352 can be closed/on (with the rest open/off) while the switches 626, 601, 639, 630, 635, 637 of the RCS 354 can be closed/on (with the rest open/off). The switches that are closed are annotated with a dashed circle. All elements can be swept, or a subset can be swept.

The controller 360 can enable each antenna element 322 sequentially, and measure Pdet_MAIN and Pdet_PA (for each antenna element 322) by setting a gain control index (e.g., automatic gain control (AGC) or RGI) to a linear output range. The linear output range may include a first threshold setting a lower limit for the linear output range and a second threshold setting a upper limit for the linear output range. If the difference between the Pdet_MAIN and Pdet_PA is less than the first threshold, such a difference may be indicative that the passive s11 impedance is lower than a lower limit. If the difference between the Pdet_MAIN and Pdet_PA is greater than the second threshold, such a difference may be indicative that the passive s11 impedance is greater than an upper limit. The upper and lower limits may be predetermined and based on characterization of the circuit. In both instances, the controller 360 can then remove the affected antenna element 322 from the codebook. If the difference between the Pdet_MAIN and Pdet_PA is greater than the first threshold but less than second threshold, then the process can proceed.

Antenna elements 322 that are less that the first threshold or greater that the second threshold can be referred to as "Ex" or element X. For a given beamforming pattern, Ex elements may be disabled during transmission.

As another example, if the function 10*log 10 (Pdet_MAIN)−10*log 10 (Pdet_PA) for a given antenna element is less than a first threshold, such as a predetermined "low" threshold (e.g., threshold_PA_LO), such a difference may be indicative that the passive s11 impedance is lower than the lower limit. Conversely, if the function 10*log 10 (Pdet_MAIN)−10*log 10 (Pdet_PA), for a given antenna element 322 is greater than a second threshold, such as a predetermined "high" threshold (e.g., threshold_PA_HI), such a difference may be indicative that the passive s11 impedance is greater than the upper limit (like VSWR 2:1 on the low impedance side). If 10*log 10 (Pdet_MAIN)−10*log 10 (Pdet_PA) is greater than the threshold_PA_LO but less than threshold_PA_HI, then the process can proceed. Thus, antenna element 322 less than PA_LO or greater than PA_HI may be referred to as "Ex" and the Pdet_MAIN and Pdet_PA may be referred to as Pdet_MAIN_Ex and Pdet_PA_Ex, respectively.

FIG. 8 is a graphical representation of a third state of the detector of FIG. 6. In a third step of the beam char mode, the controller 360 can maintain the same settings (e.g., switch settings) within the DRCS 352 shown in FIG. 7, and turn off each antenna element 322 (for example, deactivate each element based on the beam forming codebook setting, e.g., by zeroing power supplied the element), measuring the voltage reflected (Pdet_RVS) from each antenna element 322. This can determine whether one or more of the antenna elements 322 fails the reverse power level threshold. That is, whether the value Pdet_RVS is above a predetermined threshold. Such elements can be referred to as Ey (element y), herein.

In the configuration shown, the switches 609, 624, 619, 622 of the DRCS 352 can be closed/on (with the rest open/off) while the switches 605, 627, 629, 638, 634, 636 of the RCS 354 can be closed/on (with the rest open/off). The switches that are closed are annotated with a dashed circle.

If the difference between Pdet_RVS and Pdet_MAIN for a given antenna element is greater than a predetermined reverse power threshold, the coupling from the other elements are larger than the main transmitting signal by a given limit, and thus not desired from a reliability and current consumption point of view. In this situation the element 322 is referred to Ey and can be listed in the codebook. If the difference between Pdet_RVS and Pdet_MAIN for the antenna element is less than the predetermined reverse power threshold, then it is performing at a proper operation limit and could move to next element for the corresponding codebook. The process moves to the next step. Every element for each codebook can be checked in this manner.

For example, if E_ACTIVE_S11=10·Log$_{10}$(Pdet_RVS)−10·Log$_{10}$(Pdet_MAIN), where E refers to the given element, is greater than a predetermined reverse power threshold (threshold_REVS), the coupling from the other elements are larger than the main transmitting signal by a given limit, and thus not desired from a reliability and current consumption point of view. In this situation the element 322 is referred to as Ey and can be removed from the codebook, while the Pdet_MAIN and Pdet_PA may be referred to as Pdet_MAIN_Ey and Pdet_PA_Ey, respectively.

If $E\_ACTIVE\_S11 = 10 \cdot \text{Log}_{10}(\text{Pdet\_RVS}) - 10 \cdot \text{Log}_{10}(\text{Pdet\_MAIN})$ is less than the predetermined reverse power threshold (threshold_REVS), then it is under safe operation limit and could move to next element for the corresponding codebook. The process moves to the next step. Every element for each codebook can be checked in this manner.

Figure 9:
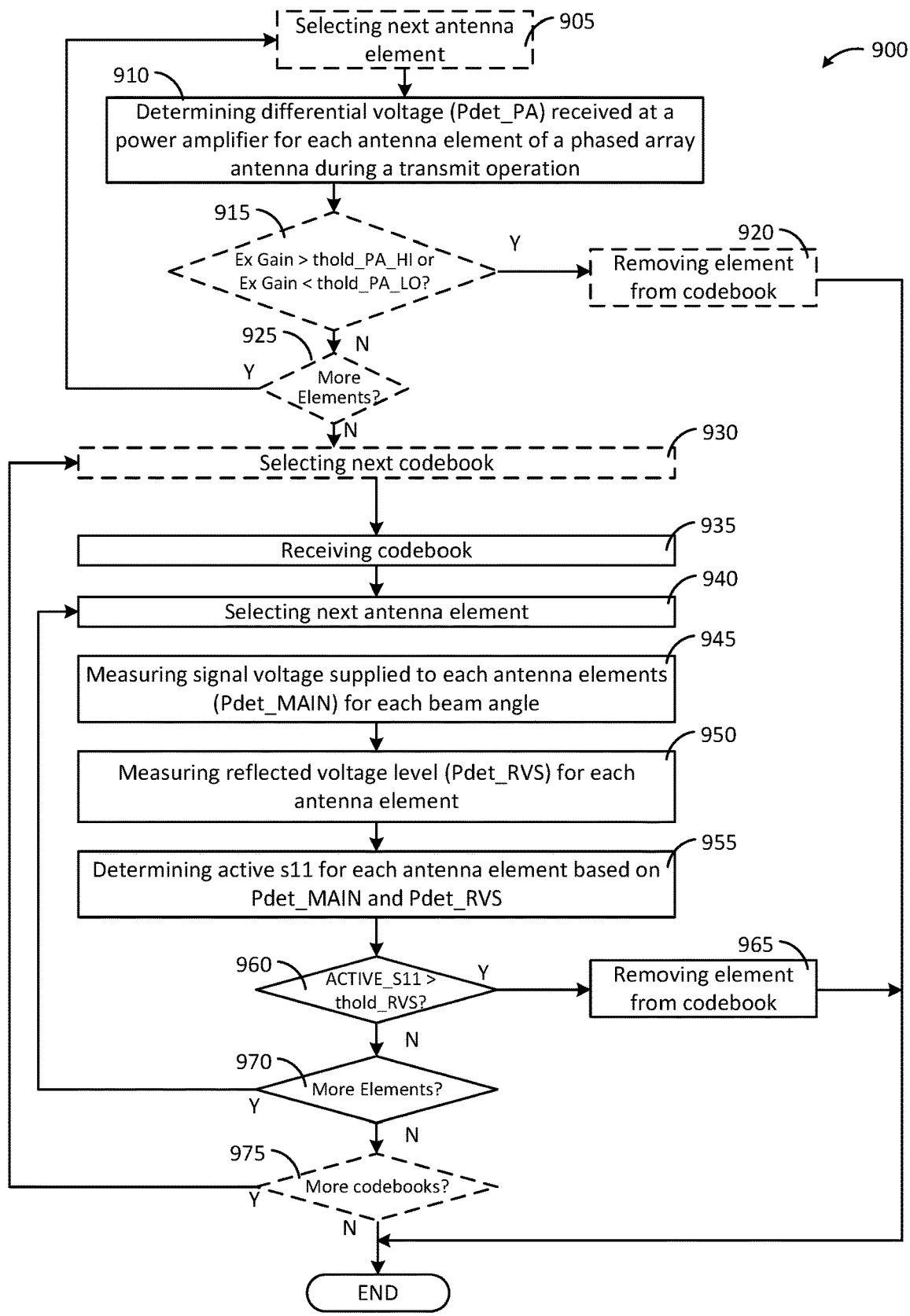
FIG. 9 is a flowchart of an embodiment of a method for detecting and managing active s11 in a phased array antenna, according to the disclosure.

FIG. 9 is a flowchart of an embodiment of a method for detecting and managing active s11 in a phased array antenna, according to the disclosure. A method 900 can be performed by the controller 360, for example.

At block 935, the controller 360 can receive a codebook for a given set of beamforming codes. In an example implementation, at optional block 905, the controller 360 can select an antenna element 322 from the phased array antenna system 216. The method 900 can optionally be iteratively performed to keep the codebook current. Embodiments herein can detect high active s11 for a given antenna element and adjust transmit power levels and enable/disable individual antenna elements 322 (e.g., and the associated transmit chains 310), for example turn off each element based on the beam forming codebook settings, based on power levels measured by the detectors 350.

In some implementations, at block 910 the controller 360 can determine a differential voltage at the input to the PA 316 during a transmit operation (Pdet_PA). As used herein, this voltage differential is given the shorthand Pdet_PA (e.g., power detector, power amplifier). The voltage sensed by the CS 352 is supplied as a current to the voltage generator 358. While illustrated prior to block 935, block 910 may be performed after receiving the codebook at 935.

In some implementations, at optional block 915 the controller 360 can optionally determine whether the gain for the tested element is greater than a threshold high power level (threshold_PA_HI) or lower than a threshold low power level (threshold_PA_LO). If yes, at optional block 920, then the controller 360 can remove the element 322 (Ex) from the codebook and proceed to the end of the method 900. If no, then the method can proceed to optional decision block 925. The noted element Ex will then not be used for transmission in the measured beamforming code set.

At optional block 925, the controller 360 can optionally determine if there are more elements 322 to test and return to selecting the next antenna element 322. Based on the configuration of the switches within the CS 352 and the CS 354 (e.g., the configuration shown in FIG. 6), the controller 360 can sense the Pdet_PA, and interleave samples of Pdet_PA from each transmit chain 310 and thus each antenna element 322. If there are no more elements 322 to test, then the controller 360 can optionally select the next codebook at optional block 930.

At block 935, the controller 360 can receive a codebook. For example, the received codebook can be the selected next codebook described above; however, the codebook may be any supplied or selected codebook and need not be selected according to the above described example. At block 940, the controller 360 can test the elements 322 individually for a given beamforming angle according to the received codebook. For example, the controller 360 selects an antenna element from the elements 322 to test.

At block 945, the controller 360 can turn off each element based on the beam forming codebook setting. The controller 360 can then measure signal voltage supplied to each antenna elements (Pdet_MAIN) for each beam angle in the codebook.

At block 950 the controller 360 can measure reflected voltage level (Pdet_RVS) for each antenna element for each beam angle in the codebook.

As noted above, the controller 360 may determine the differential voltage (Pdet_PA) after block 935, for example, simultaneously, before, or after block 945 and/or 950.

At block 955, the controller 360 can determine active s11 for each antenna element 322 based on the measured Pdet_MAIN and the Pdet_RVS, for example, as described above in connection to FIG. 8.

At decision block 960, if the active S11 is greater than a threshold (threshold_RVS), then the element may be referred to as Ey and can be removed from the codebook at block 965.

If at decision block 960 the active S11 is less than or equal to the threshold_RVS, the method 900 can move to decision block 970.

At decision block 970, if there are more elements to test in the codebook, then the method 900 proceeds back to block 940. Otherwise, the process 900 may end.

In an example implementation, after block 970 and if there are no more elements to test in the codebook, the controller may optionally determine if there are more codebooks to test at optional block 975. If there are more codebooks to test the controller 360 may return to selecting the next codebook at optional block 930, as described above in the optional implementation. Otherwise, if there are no more codebooks to test, the controller 360 can optionally update beamforming lookup tables for the codebook for each beamforming angle using the elements 322. For example, beamforming lookup tables for each angle can be updated to include or exclude antenna elements based on the inclusion or exclusion of the antenna elements in each codebook. In addition, such updates can also be based on the removal of elements as described above in the optional embodiment and inclusion of elements at block 970 to respective codebooks. Then, the controller 360 can optionally reverify beamforming lookup tables, for example, by repeating the method 900 as needed with or without the optional implementations described above. Lastly, the controller 360 can optionally cause a transmission from the antenna system 216 based on the codebooks.

In an example, removing the element Ex can comprise removing reference to the element Ex in the codebook. As such beamforming codes for a given antenna element may be absent from the codebook and would not be included in an updated lookup table. As such, the element Ex may not be activated for forming a beam at a given angle where the element Ex is excluded from the codebook, and thus the lookup table. In another example, removing the element Ex may comprise setting the beamforming weights to zero (e.g., zeroing the power for driving the element Ex). Thus, while the element Ex may be still listed in the codebook, it is deactivated and essentially excluded from forming the beam.

Other Aspects

The accompanying claims and their equivalents are intended to cover such forms or modifications as would fall within the scope of the disclosure. The various components illustrated in the figures may be implemented as, for example, but not limited to, software and/or firmware on a processor or dedicated hardware. Also, the features and attributes of the specific example embodiments disclosed above may be combined in different ways to form additional embodiments, all of which fall within the scope of the disclosure.

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an," or "the" is not to be construed as limiting the element to the singular.

The various illustrative logical blocks, modules, and algorithm operations described in connection with the embodiments disclosed herein may be implemented as electronic hardware, computer software, or combinations of both. To clearly illustrate this interchangeability of hardware and software, various illustrative components, blocks, modules, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present inventive concept.

The hardware used to implement the various illustrative logics, logical blocks, and modules described in connection with the various embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary embodiments, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects.

Thus, the claims are not intended to be limited to the aspects shown herein, but is to be accorded the full scope consistent with the language claims, wherein reference to an element in the singular is not intended to mean "one and only one" unless specifically so stated, but rather "one or more."

The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more.

Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A device coupled to an antenna element of a plurality of antenna elements of a phased array antenna, the device comprising;

a power amplifier (PA) having an output coupled to the antenna element of the plurality of antenna elements via a transmission line;

a first current sensor coupled to an input of the PA, the first current sensor being configured to convert a voltage at the input to a first current;
a second current sensor in communication with the transmission line, the second current sensor being configured to
convert a coupled voltage corresponding to a signal transmitted from the PA to the antenna element, to a second current, and
convert a reflected voltage reflected from the antenna element, to a third current; and
a voltage generator coupled to the first current sensor and the second current sensor and configured to convert the first current, the second current, and the third current to an output voltage at a generator output.

2. The device of claim 1, further comprising a coupler inductively coupled to the transmission line and configured to provide the coupled voltage and the reflected voltage to the second current sensor.

3. The device of claim 2, wherein the coupler comprises a compact coupler having
a reflection impedance including a first variable capacitance coupled in parallel with an inductance, and
a coupling impedance including a second variable capacitance coupled in parallel with a variable resistance.

4. The device of claim 1, wherein the first current sensor comprises a first plurality of switches selectively coupling the input of the PA to a first transistor.

5. The device of claim 4, wherein the first plurality of switches communicatively couple the input of the PA to the voltage generator via the first transistor in a first position, and electrically isolates the input of the PA from the first current sensor in a second position.

6. The device of claim 4, wherein the second current sensor comprises a second plurality of switches selectively coupling the transmission line to a first pair of transistors.

7. The device of claim 6, wherein the second plurality of switches enable the second current sensor to produce the second current corresponding to the coupled voltage in a first position, and produce the third current corresponding to the reflected voltage in a second position.

8. The device of claim 1, wherein the voltage generator comprises:
a bias circuit coupled to the first current sensor and the second current sensor, and
an output circuit coupled to the first current sensor and the second current sensor.

9. A communications device comprising a phased array antenna having a transmit path for each antenna element of the phased array, wherein each transmit path comprises the device of claim 1.

10. The communications device of claim 9, further comprising a controller configured to selectively activate and deactivate one or more of the plurality of antenna elements based on the output voltage.

11. An apparatus for detection of active return loss for each antenna element of a plurality of antenna elements of a phased array antenna, the apparatus comprising:
a means for amplifying coupled to each antenna element of the plurality of elements via a transmission line;
first sensing means for sensing a voltage at an input of the means for amplifying and converting the voltage at the input to first current;
a second sensing means for sensing a voltage on the transmission line, the second sensing means comprising
means for converting a coupled voltage corresponding to a signal transmitted from the means for amplifying to a respective antenna element, to a second current, and
means for converting a reflected voltage reflected from the respective antenna element to a third current; and
means for generating a voltage based on the first current, the second current, and the third current.

12. The apparatus of claim 11, further comprising a coupling means inductively coupled to the transmission line and configured to provide the coupled voltage and the reflected voltage to the second sensing means.

13. The apparatus of claim 11, wherein the coupling means comprises a low directivity coupler having
a reflection impedance including a first variable capacitance coupled in parallel with an inductance, and
a coupling impedance including a second variable capacitance coupled in parallel with a variable resistance.

14. The apparatus of claim 11, wherein the first sensing means comprises a first plurality of switches selectively coupling the input of the means for amplifying to a first pair of transistors.

15. The apparatus of claim 14, wherein the first plurality of switches communicatively couple the input of the means for amplifying to the means for generating a voltage via the first pair of transistors in a first position, and electrically isolate the input of the means for amplifying from the first sensing means in a second position.

16. The apparatus of claim 14, wherein the second sensing means comprises a second plurality of switches selectively coupling the transmission line to a second pair of transistors.

17. The apparatus of claim 16, wherein the second plurality of switches enable the second sensing means to produce the second current corresponding to the coupled voltage in a first position, and produce the third current corresponding to the reflected voltage in a second position.

18. The apparatus of claim 11, wherein the means for generating a voltage comprises:
a bias circuit coupled to the first sensing means and the second sensing means, and
an output circuit coupled to the first sensing means and the second sensing means.

19. A communications device comprising a phased array antenna having a transmit path for each antenna element of the phased array, wherein each transmit path comprises the apparatus of claim 11.

20. A triple mode power detector coupled to a plurality of antenna elements of a phased array antenna, the triple mode power detector comprising:
a differential root mean square (RMS) current sensor (DRCS) configured to convert a first voltage differential across inputs of a power amplifier (PA) to first current, the PA being coupled to a respective antenna element of the plurality of antenna elements via a transmission line;
an RMS current sensor (RCS) configured to
convert a coupled voltage corresponding to a signal transmitted from the PA to the respective antenna element, to a second current, and
convert a reflected voltage corresponding to a signal reflected from the respective antenna element, to a third current, and
a voltage generator coupled to the DRCS and the RCS and configured to convert the first current, the second current, and the third current to an output voltage at a generator output.

21. The triple mode power detector of claim 20, further comprising a coupler inductively coupled to the transmission line and configured to provide the coupled voltage and the reflected voltage to the RMS current sensor.

22. The triple mode power detector of claim 21, wherein the coupler comprises a low directivity coupler having
a reflection impedance including a first variable capacitance coupled in parallel with an inductance, and
a coupling impedance including a second variable capacitance coupled in parallel with a variable resistance.

23. The triple mode power detector of claim 20, wherein the differential RMS current sensor comprises a first plurality of switches selectively coupling the inputs of the PA to a first pair of transistors.

24. The triple mode power detector of claim 23, wherein the first plurality of switches communicatively couple the inputs of the PA to the voltage generator via the first pair of transistors in a first position, and electrically isolate the inputs of the PA from the differential RMS current sensor in a second position.

25. The triple mode power detector of claim 23, wherein the RMS current sensor comprises a second plurality of switches selectively coupling the transmission line to a second pair of transistors.

26. The triple mode power detector of claim 25, wherein the second plurality of switches enable the RMS current sensor to produce the second current corresponding to the coupled voltage in a first position, and produce the third current corresponding to the reflected voltage in a second position.

27. A method for detection of active return loss for an antenna element of a plurality of antenna elements of a phased array antenna, the method comprising:

converting a voltage to a first current, the voltage sensed by a first current sensor coupled to an input of a power amplifier (PA), wherein the PA has an output coupled to the antenna element of the plurality of elements via a transmission line;

converting, by a second current sensor in communication with the transmission line, a coupled voltage corresponding to a signal transmitted from the PA to the antenna element, to a second current;

converting, by the second current sensor, a reflected voltage reflected from the antenna element, to a third current; and converting, by a voltage generator coupled to the first current sensor and the second current sensor, the first current, the second current, and the third current to an output voltage at a generator output.

28. The method of claim 27, further comprising providing the coupled voltage and the reflected voltage to the second current sensor by a coupler inductively coupled to the transmission line.

29. The method of claim 28, wherein the couple comprises a compact coupler having
a reflection impedance including a first variable capacitance coupled in parallel with an inductance, and
a coupling impedance including a second variable capacitance coupled in parallel with a variable resistance.

30. The method of claim 27, wherein the first current sensor comprises a first plurality of switches, and the method further comprises selectively coupling the input of the PA to a first pair of transistors.

* * * * *